United States Patent [19]

Kortier et al.

[11] 4,211,889

[45] Jul. 8, 1980

[54] THERMOELECTRIC MODULE

[75] Inventors: William E. Kortier; John J. Mueller; Philip E. Eggers, all of Columbus, Ohio

[73] Assignee: The United States of America as represented by the Department of Energy, Washington, D.C.

[21] Appl. No.: 761,894

[22] Filed: Sep. 16, 1968

[51] Int. Cl.² ............................................. H01V 1/15
[52] U.S. Cl. ..................................... 136/237; 136/238
[58] Field of Search ............... 136/205, 203, 237, 204, 136/238, 223, 208, 228

[56] References Cited

U.S. PATENT DOCUMENTS

| | | | |
|---|---|---|---|
| 2,997,514 | 8/1961 | Roeder, Jr. ............................ | 136/204 |
| 3,051,767 | 8/1962 | Fredrick et al. .................. | 136/205 X |
| 3,076,051 | 1/1963 | Haba .................................... | 136/204 |
| 3,082,276 | 3/1963 | Corry et al. ........................... | 136/205 |
| 3,232,719 | 2/1966 | Ritchie ............................. | 136/237 X |
| 3,279,954 | 10/1966 | Cody et al. .......................... | 136/205 |
| 3,296,033 | 1/1967 | Scuro et al. .......................... | 136/205 |
| 3,351,498 | 11/1967 | Shinn et al. ........................... | 136/205 |
| 3,382,109 | 5/1968 | Kendall, Jr. et al. ................ | 136/237 |
| 3,411,955 | 11/1968 | Weiss .................................... | 136/205 |
| 3,444,005 | 5/1969 | Avis et al. ............................ | 136/205 |
| 3,510,362 | 5/1970 | Charland et al. ................. | 136/205 X |

*Primary Examiner*—Harvey E. Behrend
*Attorney, Agent, or Firm*—R. V. Lupo; Frank H. Jackson

[57] ABSTRACT

A thermoelectric module containing lead telluride as the thermoelectric material is encapsulated as tightly as possible in a stainless steel canister to provide minimum void volume in the canister. The lead telluride thermoelectric elements are pressure-contacted to a tungsten hot strap and metallurgically bonded at the cold junction to iron shoes with a barrier layer of tin telluride between the iron shoe and the p-type lead telluride element.

1 Claim, 1 Drawing Figure

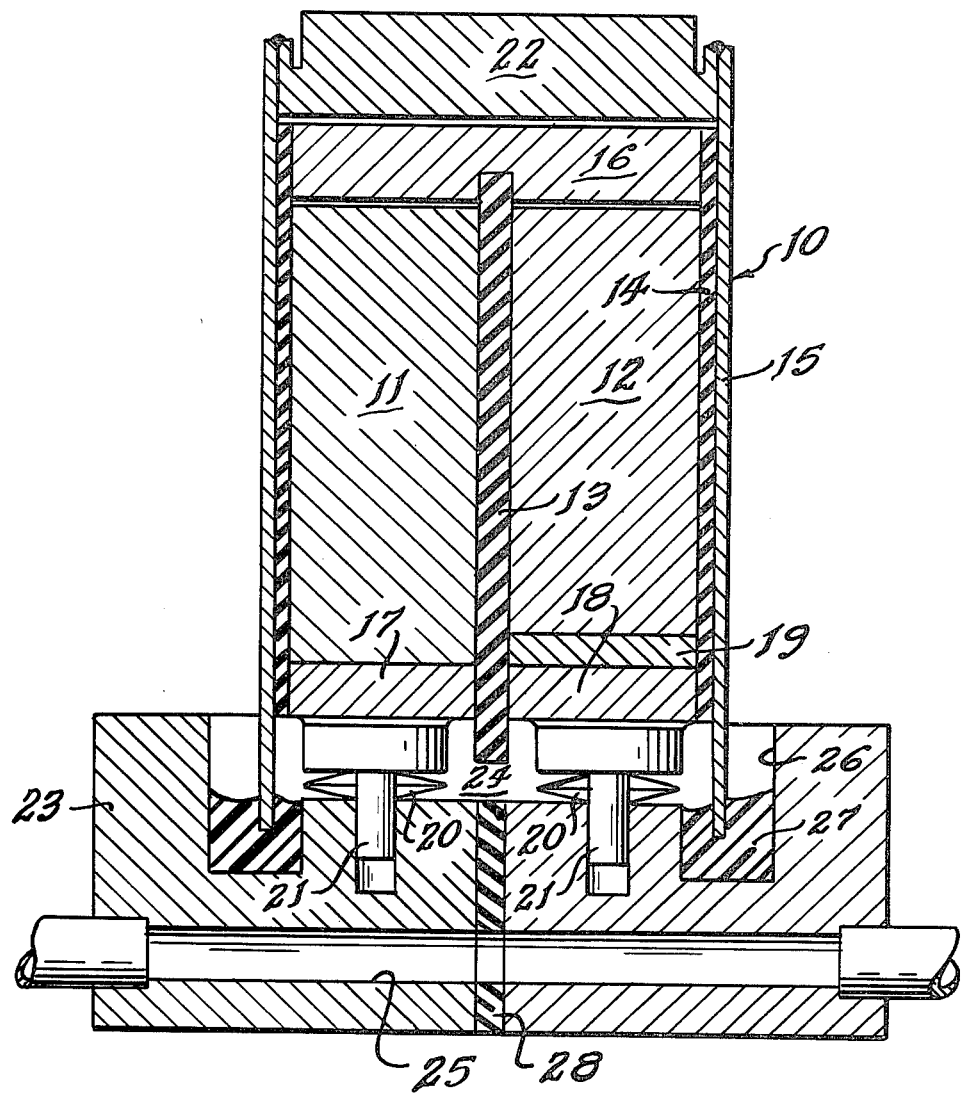

THERMOELECTRIC MODULE

CONTRACTUAL ORIGIN OF THE INVENTION

The invention described herein was made in the course of, or under, a contract with the UNITED STATES ATOMIC ENERGY COMMISSION.

BACKGROUND OF THE INVENTION

This invention relates to a thermoelectric module. In more detail the invention relates to a nondegrading lead telluride thermoelectric module with low contact resistance junctions.

The principle of thermoelectric conversion has been known for many years but until recent years has found little other application than in temperature measurement and control. Recently, however, development of power systems for use at remote locations—such as in space—has become necessary and thermoelectric conversion has been utilized for this purpose.

Desirable properties for thermoelectric materials include (1) proper free-electron generation characteristics, i.e., the number of free electrons must be sufficient to overcome internal electrical resistance, yet not so great as to introduce scattering effects, (2) low thermal conductivity so that heat cannot flow through the material without performing some useful work, (3) ability to operate at high temperatures, and (3) various additional property requirements depending on the specific application for the material.

Because of (1) and (2) above, semiconductor materials are more efficient thermoelectric materials than ordinary metals. One material that has found practical application is lead telluride (PbTe), a binary compound of lead and tellurium capable of operation at temperatures up to 1100°–1200° F. By addition of an impurity (a process referred to as doping) the lead telluride can be made to operate as an n- or p-thermoelectric material. Although lead telluride has been used more widely than any other thermoelectric material up to this date, thermoelectric modules made from lead telluride have not performed to the levels theoretically available from the material. An additional problem to that of achieving high-level performance is that of performance degradation during operation of the module. Postoperative examinations of elements from modules have identified the p-type elements as being the primary source of the trouble; specifically the resistance increases in the hot zone of the p-type leg of the thermocouple. This degradation of the module substantially reduces module life from that theoretically attainable.

A substantial effort has, of course, been made to identify the cause of and to suggest means for reducing the degradation of lead telluride thermoelectric modules. We feel that we have identified this cause and have suggested means whereby degradation of such modules can be substantially reduced, thereby providing longer life for the modules.

SUMMARY OF THE INVENTION

We have found that degradation of p-type lead telluride thermoelectric elements can be attributed primarily to very slight changes in the proportion of tellurium present in the element. P-type lead telluride elements are doped with excess tellurium as well as sodium and reduction in the amount of tellurium present adversely affects the performance of the element. This reduction in the amount of tellurium present can occur through reaction of the excess tellurium with the material of the hot contact or shoe or by sublimation of the tellurium. It appears that the presence of oxygen in even very small amounts in the atmosphere surrounding the thermoelectric element promotes the sublimation of tellurium.

We have found that we can reduce degradation of the power developed by the thermoelectric element by (a) employing a tungsten contact at the hot junction of the p-type element and an iron shoe separated from the thermoelectric material by a layer of tin telluride at the cold junction of the p-type element and by (b) hermetically sealing the thermoelectric module within a casing which fits as tightly as possible around the thermoelectric material to provide minimum voids within the casing.

While it is clear that each of these expedients taken individually produces improved results, it is also clear that it is only by employing all of the expedients simultaneously that maximum benefits from the invention are attained.

BRIEF DESCRIPTION OF THE DRAWING

The drawing is a sketch of a thermoelectric module constructed in accordance with the present invention. Although the sketch is of a module constructed specifically for experimental purposes, an operational module would not differ from the sketch in details material to the present invention.

DESCRIPTION OF THE PREFERRED EMBODIMENT

As shown in the drawing, a rectangular thermoelectric module 10 constructed in accordance with the present invention includes an n-type lead telluride (PbTe) thermoelectric element 11 separated from a p-type thermoelectric element 12 by a mica barrier sheet 13. The n-type PbTe element is doped with iodine and excess lead and the p-type PbTe element is doped with sodium and excess tellurium. These elements are enclosed within a mica sleeve 14 and the entire unit is hermetically sealed within a stainless steel casing 15 which tightly encloses the module to provide minimum voids within the casing.

Thermoelectric module 10 is provided with a tungsten hot strap 16 which contacts the hot end of both the n-type thermoelectric element 11 and the p-type thermoelectric element 12 and with iron shoes 17 and 18 on the cold ends of the n-type and p-type thermoelectric elements, respectively. Shoe 17 is brazed directly to n-type thermoelectric element 11, but shoe 18 is separated from p-type thermoelectric element 12 by a barrier layer 19 of tin telluride. The unit including shoe 18, barrier layer 19 and element 12 is formed by cold pressing and sintering under axial pressure.

Contact between elements 11 and 12 and tungsten hot strap 16 is obtained by the pressure of Belleville springs 20 against copper spring followers 21 which force the n-type and p-type elements against tungsten hot strap 16. Hot platen 22, which is welded to the top of stainless steel casing 15, resists this pressure. Spring followers 21 are soldered to iron shoes 17 and 18 using an In-Sn solder.

A cold sink 23 formed of copper includes a cavity 24 in which Belleville springs 20 and spring followers 21 are disposed, a coolant tube 25 extending through the cold sink, and a rectangular well 26 which receives the free end of casing 15, the well being filled with an epoxy resin which serves as a seal 27. Cold sink 23 is electrically divided by electrical insulation 28 to prevent a short circuit between the n-type and the p-type thermoelectric elements. Electrical contacts, not shown, are, of course, also provided.

Thus, it is evident that the design of the containers features (1) a welded stainless steel enclosure at the hot junction and a high-density epoxy seal at the cold junction of the couple to assure isolation from the environment, (2) an internally contained spring-loading assembly to maintain the required level of axial pressure on the thermoelectric element junctions, and (3) a minimum void volume in order to limit the amount of material lost through sublimation, particularly the tellurium dopant loss in the 2p-PbTe material.

An extensive testing program has been undertaken to develop thermocouples of maximum predictable conversion efficiency and negligible degradation of power output during service. As a part of this program, tests were made to determine the cause of degradation of p-type PbTe thermoelectric elements. When the cause of the degradation was determined, means for avoiding the degradation were developed.

Since iron is the most obvious choice for use as contact or shoe material with PbTe thermoelectric elements, one of the first items investigated was the bond between a PbTe element and an iron shoe. N-type PbTe elements showed no evidence of reaction with iron. The structure remains unchanged after operation for 1000 hours at 980° F. On the other hand, the p-type PbTe showed clear evidence of a second-phase reaction product adjacent to the interface. Microprobe analysis showed the presence of iron in this phase, an apparent result of diffusion and reaction of the iron with the excess tellurium in p-type PbTe. The amount of this second phase was found to increase with time of operation at the typical hot-junction temperature of 980° F.

Since tin telluride (SnTe) is known to be a p-type thermoelectric material of low resistivity which is less fragile than is p-type PbTe, a SnTe layer was incorporated into the element between the PbTe and the iron shoe to prevent direct contact of the thermoelectric material with the iron shoe and provide a buffer layer between materials that expand differentially.

The thermoelectric elements may be made by simultaneous brazing and sintering or by cold pressing and sintering under axial pressure. Shoe composites of iron having a 1/32-inch layer of SnTe on one side thereof are green pressed simultaneously at 100,000 psi; interlocking of the iron and SnTe is accomplished in this manner. A layer of tinfoil is pressed into the exposed surface of the SnTe during the initial pressing step to obtain a continuous film of bonding agent mechanically held in place on the surface. The PbTe body was pressed to 90 percent of theoretical density with a layer of tinfoil pressed into each end in a manner similar to that accomplished on the shoes.

The bonded and sintered element was made by furnace heating for one hour at 1200° F. under a compressive spring load. During this process, the PbTe was effectively sintered to a higher density and was joined to the SnTe layers on the shoes. The resulting element was found to be structurally sound and of low resistance.

Another method of preparing these elements does not require the use of tin as in the process just described. The element is fabricated by green pressing a powder composite of PbTe, SnTe and iron and sintering in hydrogen at 1200° F. with an axial load applied.

Elements prepared by both procedures showed an acceptable resistance across the bond and a generally high level of stability through a cycling period which involved six to eight cycles from a hot-junction temperature of 980° F. to near room temperature. However, during subsequent life testing over an extended period of time (1000 hours), a significant degradation of power occurred. Resistance traverses of the elements after testing disclosed a significant increase in material resistance in the zone of the hot junction.

The life test (1000-hour or longer test) is carried out as a continuous operation at a fixed hot- and cold-junction temperature and a fixed external load. The couple is probed (room temperature) after mounting to determine pretest contact resistance values. The couple is installed in a test chamber which is evacuated ($\sim 25\mu$ of mercury) for 24 hours at room temperature. The chamber is backfilled with argon to atmospheric pressure. The thermoelectric couple is then heated at a rate of approximately 10° F. per minute.

After several hours at temperature (980° F.), a wattmeter and supporting circuitry are used to adjust the external load resistance to obtain maximum power output from the thermoelectric couple.

The couple is operated at the initially established load and operating temperatures and performance are monitored until the output power degradation of the thermoelectric couple exceeds 10 percent of the initial power output. The couple is then removed and subjected to a posttest examination of the junctions. If desired, they are then subjected to metallographic examination.

It is hypothesized that tellurium is being depleted from the PbTe through reaction with the free tin phase in the SnTe. It is only if the layer were thinner that a reaction between iron and the excess tellurium in the PbTe would become a factor. Life tests on elements containing a 30-mil SnTe barrier indicated that an element operated for 6460 hours at 920° F. had degraded in power approximately 17 percent. Seebeck coefficient probing showed a large maxima at the hot end and center of the element. These maxima are attributed to effects of interaction of p-type PbTe with the gaseous environment with a smaller superimposed effect at the hot end from interaction between the SnTe and PbTe.

Thus it is clear that use of a tin telluride barrier layer is not the complete and final answer to the problem and it becomes necessary to try other metals as contact material. Unfortunately PbTe is sensitive to contact with most metals. However, tungsten has been shown by others to be completely inert to PbTe. In addition, review of phase-diagram data shows that tungsten may not form compounds with tellurium. Consequently, purely on the basis of its lack of chemical reactivity, it appears to be a promising candidate for use with PbTe. Unfortunately the difference in expansion rate between tungsten and PbTe is extremely great and previous work has shown that bonding cannot be achieved.

We have employed tungsten as contact material and shown that the material can be satisfactorily used in a pressure-contact arrangement. However, these tests showed that it is necessary to eliminate the copper hot strap normally used to attain satisfactory results and contact the thermoelectric elements directly with a tungsten hot strap.

After approximately 3900 hours on test in a life test as described above, couples containing a tungsten hot strap pressure-contacted under about 100 psi pressure to p-type and n-type thermoelectric elements operating at a hot-junction temperature of 920° F. are more stable than couples containing tungsten shoes pressure-contacted to p-type PbTe with a SnTe braze bond between the tungsten shoe and a copper hot strap connecting the n- and p-type elements. In addition, after approximately 4800 hours on test, couples containing a tungsten hot strap pressure-contacted to p-type and n-type PbTe elements operating at a hot-junction temperature of 920° F. in hydrogen test environment are significantly more stable than similar couples operating in an argon environment. No significant degradation was noted over this period of time. No couples tested previously in this program had exhibited output power stability comparable to these elements.

While tungsten is an excellent hot-zone contact material, it is not completely satisfactory as a cold-zone contact material. It is believed that at temperatures in the neighborhood of 900° or 1000° F. the lead telluride softens slightly so that pressure alone will result in a good electrical contact. At the cold-zone temperature of about 350° F. this does not occur. It is thus necessary to employ an iron shoe with a tin telluride barrier layer between the iron shoe and the lead telluride. The barrier layer is malleable enough to cope with the differential contraction of the iron and lead telluride when cooled from the bonding temperature. The barrier layer probably undergoes some creep or slip but maintains good electrical contact in spite of mismatches due to thermal cycling.

One further and very important feature of the invention will next be discussed. It has been determined that one of the primary causes for degradation of p-type thermoelectric elements arises from sublimation of the tellurium present in PbTe in excess of that required for stoichiometry. It is believed that this is promoted by the presence of oxygen in even very small amounts in the environment. Crystals were observed growing from the surfaces of copper blocks attached to the shoes of a p-type PbTe element subjected to long-term isothermal contact-resistivity tests performed in static argon at 980° F. Examination of the crystals from one of the specimens by means of the electron-beam microprobe showed the crystals to be almost entirely a compound of copper and tellurium of the formulation $Cu_2Te$. A minor quantity of lead was located centrally in the crystals. The high concentration of tellurium relative to the amount of lead indicated a preferential loss of the excess tellurium phase from the PbTe. This provides a possible explanation for the rise in bulk-material resistivity which had been experienced during the test.

It was therefore concluded that the change in electrical properties of the subject test element was degrading in nature and primarily caused by tellurium sublimation. Tellurium was lost to the extent that the free phase was eliminated and the tellurium in solid solution was decreased since the electrical properties are determined by the amount of tellurium in solid solution. This last statement was shown to be true by varying the amount of tellurium in PbTe. The data obtained showed that the Seebeck coefficient remains essentially unchanged over a 0.7 w/o tellurium range of variation from +0.30 w/o to −0.39 w/o (variation from original composition) between the compositions −0.39 w/o and −0.61 w/o tellurium, the coefficient responds rapidly to change in composition and the effect on the coefficient tends to saturate at about the −0.80 w/o tellurium composition.

Also, the trends of change in the resistivity closely parallel those exhibited by the Seebeck coefficient data.

For operation at the desired temperature, it thus becomes necessary to minimize the loss of tellurium from the p-type lead telluride. In accordance with the present invention, this is accomplished by hermetically sealing the module within a casing which tightly encloses the module, so that minimum voids are present within the casing. This prevents tellurium from subliming, by providing a minimum opportunity for sublimation and also prevents oxygen contamination of the environment. Accordingly, the construction shown in the drawing and previously described was developed. This construction clearly prevents loss of tellurium by reaction with the shoe material or by sublimation. Accordingly, the described module will have a longer life than those used heretofore.

The effect of oxygen contamination in the atmosphere of the thermoelectric element is sufficiently important to warrant further discussion. Oxygen must be positively excluded during fabrication because studies show that oxygen is a prime factor affecting the electrical properties of PbTe thermoelectric elements.

1. Elements prepared from fine (minus 325 mesh) powder are of exceedingly high resistivity; those made from coarse powder are of lower resistivity. Vacuum-fusion analyses show that fine powder contains a larger amount of oxygen than coarser powder.

2. Coarse powder (minus 100 plus 325 mesh) whose particle size range is increased by mechanical blending and as a result includes a minus 325 mesh fraction yields elements of higher resistivity than elements made without the fines.

3. Hydrogen sintering reduces the oxygen content and yields electrical properties which are characteristic of uncontaminated material.

In addition, it has been observed that oxygen contamination in the atmosphere of the module plays a significant role in the sublimation of tellurium. Although crystals containing tellurium were found when oxygen was present in the atmosphere of the test vessel, no such crystals were found when PbTe specimens were heat-treated for 63 hours at 900° F. in pure argon gettered by tantalum. Thus it is necessary to hermetically seal the casing for the module to prevent oxygen contamination.

Finally, life tests have been performed on hermetically sealed modules constructed as shown in the drawing. After about 1600 hours on test at 920° F., the couple is exhibiting (1) stable open-circuit voltage of both the p-type and the n-type thermoelectric elements and (2) increasing output power with time. An increase in output power is attributed to a decrease in the electrical resistance of the pressure-contacted junctions which normally occurs during the first 50–100 hours depending on the magnitude of the spring-load pressure. Based on present power and open-circuit voltage measurements, the couple should operate with long-term stability in output power.

It will be understood that the invention is not to be limited to the details given herein but that it may be modified within the scope of the appended claims.

The embodiments of the invention in which an exclusive property or privilege is claimed are defined as follows:

1. A thermoelectric module comprising an n-type lead telluride thermoelectric element doped with iodine and excess lead; a p-type lead telluride thermoelectric element doped with sodium and excess tellurium; a mica partition separating said n- and p-type thermoelectric elements; a tungsten hot strap abutting the hot ends of said thermoelectric elements; a hot platen mounted above the upper surface of said tungsten hot strap; an iron shoe metallurgically bonded to the cold end of each thermoelectric element with a barrier layer of tin telluride separating said p-type thermoelectric element from said iron shoe; a mica sleeve snuggly fitted against and surrounding said thermoelectric elements, iron shoes and tungsten hot strap; a copper cold sink situated adjacent to said iron shoes and containing a cavity; spring means disposed within said cavity so as to force said thermoelectric elements against said tungsten hot strap; an electrical insulating partition extending entirely through and electrically dividing said copper cold sink; and a hermetically sealed stainless steel casing compressively secured against said mica sleeve and encasing said thermoelectric elements in a gas-free environment, the top of said casing being welded to said hot platen and the bottom of said casing being embedded in an epoxy resin disposed within a rectangular well situated in said copper cold sink.

* * * * *